(12) United States Patent
Koo et al.

(10) Patent No.: US 8,174,961 B2
(45) Date of Patent: May 8, 2012

(54) SWITCH CONTROL DEVICE

(75) Inventors: Gwan-Bon Koo, Bucheon (KR);
Young-Bae Park, Bucheon (KR);
Sung-Won Yun, Bucheon (KR)

(73) Assignee: Fairchild Korea Semiconductor, Ltd., Bucheon (KR)

( * ) Notice: Subject to any disclaimer, the term of this patent is extended or adjusted under 35 U.S.C. 154(b) by 1320 days.

(21) Appl. No.: 11/804,468

(22) Filed: May 18, 2007

(65) Prior Publication Data

US 2007/0268169 A1    Nov. 22, 2007

(30) Foreign Application Priority Data

May 19, 2006  (KR) .................. 10-2006-0045068

(51) Int. Cl.
*H04J 7/00*      (2006.01)
*H03M 3/00*      (2006.01)
*H03K 7/08*      (2006.01)

(52) U.S. Cl. .................. 370/212; 341/143; 375/238
(58) Field of Classification Search .................. 370/390, 370/212; 341/143; 375/238
See application file for complete search history.

(56) References Cited

U.S. PATENT DOCUMENTS

| | | | | |
|---|---|---|---|---|
| 5,420,493 A * | 5/1995 | Hargadon et al. | ............. | 320/106 |
| 5,479,090 A * | 12/1995 | Schultz | ......................... | 323/284 |
| 5,619,430 A * | 4/1997 | Nolan et al. | ..................... | 702/63 |
| 7,602,166 B1 * | 10/2009 | Kang | ............................. | 323/283 |
| 2003/0137267 A1 * | 7/2003 | Blake | ............................ | 318/471 |
| 2005/0169659 A1 * | 8/2005 | Koyama et al. | ................. | 399/88 |
| 2006/0193157 A1 * | 8/2006 | Ma et al. | ....................... | 363/123 |
| 2006/0238169 A1 * | 10/2006 | Baker | ........................... | 320/150 |
| 2007/0091651 A1 * | 4/2007 | Jang | ............................ | 363/21.01 |
| 2007/0159421 A1 * | 7/2007 | Peker et al. | ..................... | 345/82 |
| 2007/0252657 A1 * | 11/2007 | Hayden | ......................... | 332/117 |
| 2008/0127963 A1 * | 6/2008 | Thompson | ................ | 126/116 A |
| 2011/0267853 A1 * | 11/2011 | Yang et al. | ................. | 363/56.01 |

* cited by examiner

*Primary Examiner* — Chi Pham
*Assistant Examiner* — Farah Faroul
(74) *Attorney, Agent, or Firm* — Sidley Austin LLP

(57) ABSTRACT

The present invention relates to a switch controlling apparatus. The switch controlling apparatus controls a main switch by using a first signal that corresponds to a current flowing to the main switch. The switch controlling apparatus includes a PWM controller for generating a control signal to control turning on/off of the main switch by using the first signal and a clock signal, and a TSD unit for changing the control signal corresponding to heat generated from the main switch. The TSD unit changes a response speed for the heat of the main switch by using the clock signal and the control signal.

32 Claims, 5 Drawing Sheets

SWITCH CONTROL DEVICE

CROSS-REFERENCE TO RELATED APPLICATION

This application claims priority to and the benefit of Korean Patent Application No. 10-2006-0045068 filed in the Korean Intellectual Property Office on May 19, 2006, the entire content of which is incorporated herein by reference.

BACKGROUND

1. Field of the Invention

The present invention relates to a switch controller for controlling turning on/off of a switch. More particularly, the present invention relates to a switch controller for preventing a switch from being damaged due to heat generated during an operation of the switch.

2. Description of the Related Art

It is difficult to respond to heat generated from a main switch in real time when a switch unit including a main switch and a switch controller that controls the switch unit are formed as two chips sharing a pack, or when the switch unit and the switch controller are respectively provided as individual packs. Particularly, the main switch may not be turned off when the main switch is overheated due to a temperature difference between the main switch and the switch controller, so that the switch can be damaged. When the temperature of the switch increases, the temperature of the switch controller increases after a delay time as well. The switch controller makes the switch turn off at a threshold temperature that the switch can endure. However, the switch controller does not sense the temperature of the switch because they are formed in separate chips. The switch controller only senses its own temperature, which is only related to the heat delivered from the switch, with a delay. Because of this separation and corresponding delay, the switch will turn off when the temperature of the switch is higher than the threshold temperature.

SUMMARY

The present invention has been made in an effort to provide a switch controlling apparatus having advantages of turning off a switch without temperature gap when the switch is over-heated.

An exemplary switch controlling apparatus according to one embodiment of the present invention controls a main switch by using a first signal that corresponds to a current flowing to the main switch.

The switch controlling apparatus includes a pulse width modulator (PWM) controller and a Thermal Shutdown (TSD) unit to protect the controller from heat damage. The PWM controller generates a control signal for controlling turning on/off of the main switch by using the first signal and a clock signal. The TSD unit modifies the control signal corresponding to heat generated from the main switch. The TSD unit in the present invention changes a response speed for the heat of the main switch by using the clock signal and the control signal.

The TSD unit includes a first flip-flop, a first switch, a second switch, and a selection unit. The first flip-flop is triggered by the control signal and generates a TSD reference voltage modification signal according to the clock signal. The first switch is turned on/off according to the TSD reference voltage modification signal. The second switch has a control electrode applied with a voltage that varies depending on a turn-on/off state of the first switch. The selection unit generates a TSD signal having a level that varies depending on a turn-on/off state of the second switch, and outputs the TSD signal to the PWM controller. The second switch is an npn transistor that is turned on/off according to a level of a signal applied to the control electrode, and a threshold voltage of the transistor is changed depending on heat generated from the main switch.

In addition, a second voltage is applied to the control electrode of the second switch when the first switch is in the turn-off state and a first voltage is applied to the control electrode of the second switch when the first switch is in the turn-on state, and the second voltage is higher than the first voltage. The TSD unit further includes an input end coupled to an output end of the first flip-flop and an inverter having an output end coupled to the control electrode of the first switch.

The TSD unit increases the response speed for the heat of the main switch when the main switch is repeatedly changed to the turn-off state by the maximum duty cycle of the clock signal more than a predetermined number of times.

The TSD unit includes a first flip-flop, a counter, a first switch, a second switch, and a selection unit. The first flip-flop is triggered by the control signal, and generates a TSD reference voltage modification signal according to the clock signal. The counter detects a change in level of the TSD reference voltage modification signal, and determines whether the number of times that the control signals has turned off the main switch due to the maximum duty cycle of the clock signal is greater than a predetermined number of times. The first switch is turned on/off according to the TSD reference voltage modification signal. The second switch has a control electrode applied with a voltage that is changed according to a turn-on/off state of the first switch. The selection unit generates a TSD signal having a level that varies in accordance with a turn-on/off state of the second switch, and outputs the TSD signal to the PWM controller.

An exemplary switch controlling apparatus according to another embodiment of the present invention controls turning on/off of a main switch. The switch controlling apparatus includes a gate driver, a pulse width modulator (PWM), and a TSD unit. The gate driver is coupled to a control electrode of the main switch, and generates a main switch control signal for controlling turning on/off of the main switch. The PWM controller is coupled to an input end of the gate driver, and generates a gate driver control signal by using a signal that corresponds to a current flowing to the main switch, a clock signal, and an output voltage generated by the current flowing to the main switch. The TSD unit increases a response speed for heat generated from the main switch when the main switch is turned off due to a maximum duty cycle of the clock signal.

The TSD unit includes a first flip-flop, a first switch, a second switch, and a selection unit. The first flip-flop receives the clock signal and the gate driver control signal, and is triggered by the gate driver control signal. The first switch is turned on/off according to an output signal of the first flip-flop. The second switch has a control electrode applied with a voltage that varies in accordance with a turn-on/off state of the first switch. The selection unit is coupled to a first electrode of the second switch, generates a TSD signal of a first level and a TSD signal of a second level according to a turn-on/off state of the second switch, and transmits the TSD signal to the PWM controller through an output end.

The selection unit includes a first power source, a second power source, a first transistor, and a second transistor. The first power source supplies a voltage corresponding to the first level. The second power source supplies a voltage corresponding to the second level. The first transistor has a first electrode coupled to the second power source, a control electrode coupled to the first electrode of the second switch, and a second electrode coupled to the output end. The second transistor has a first electrode coupled to the second power source, a control electrode coupled to the first electrode of the second switch, and a second electrode coupled to the output end.

The TSD unit further includes a first resistor, a second resistor, a third resistor, and a fourth resistor. The first resistor has a first end coupled to a third power source and a second end coupled to the first electrode of the second switch. The second resistor has a first end coupled to the first power source and a second end coupled to the control electrode of the second switch. The third resistor has a first end coupled to the control electrode of the second switch and a second end coupled to the first electrode of the first switch. The fourth resistor has first and second ends coupled between the first and second electrodes of the first switch.

The TSD unit further includes a counter coupled to the output end of the first flip-flop and that counts a period when a signal output from the output end of the first flip-flop is a third level. The switch controlling apparatus further includes an inverter having an input end coupled to the output end of the counter and an output end coupled to the control electrode of the first switch. The third level is a high level, and the first switch is an N-channel transistor.

The PWM controller includes a comparator, a PWM latch unit, and a logic gate unit. The comparator compares a voltage that corresponds to a current flowing to the main switch with a reference voltage that corresponds to an output voltage generated in accordance with an operation of the main switch, and outputs a comparison signal according to the comparison result. The PWM latch unit receives the clock signal and the comparison signal through the set end and the reset end respectively, and generates an operation signal according to a result of a logic operation performed on the clock signal and the comparison signal. The logic gate unit receives a signal output from the TSD unit, the clock signal, and the operation signal, and generates the gate driver control signal according to a result of a logic operation.

The comparator outputs a high-level signal when the voltage corresponding to the current flowing to the main switch is higher than the reference voltage, and outputs a low-level signal when the voltage corresponding to the current flowing to the main switch is lower than the reference voltage. In addition, the TSD unit includes a first flip-flop, a first switch, a second switch, and a selection unit. The first flip-flop receives the clock signal and the gate driver control signal, and is triggered by the gate driver control signal. The first switch is turned on/off according to an output signal of the first flip-flop. The second switch has a control electrode applied with a voltage that varies in accordance with a turn-on/off state of the first switch. The selection unit is coupled to the first electrode of the second switch, generates a TSD signal of a first level and a TSD signal of a second level according to the turn-on/off state of the second switch, and transmits the TSD signal to the PWM controller.

DETAILED DESCRIPTION

Figure 1:
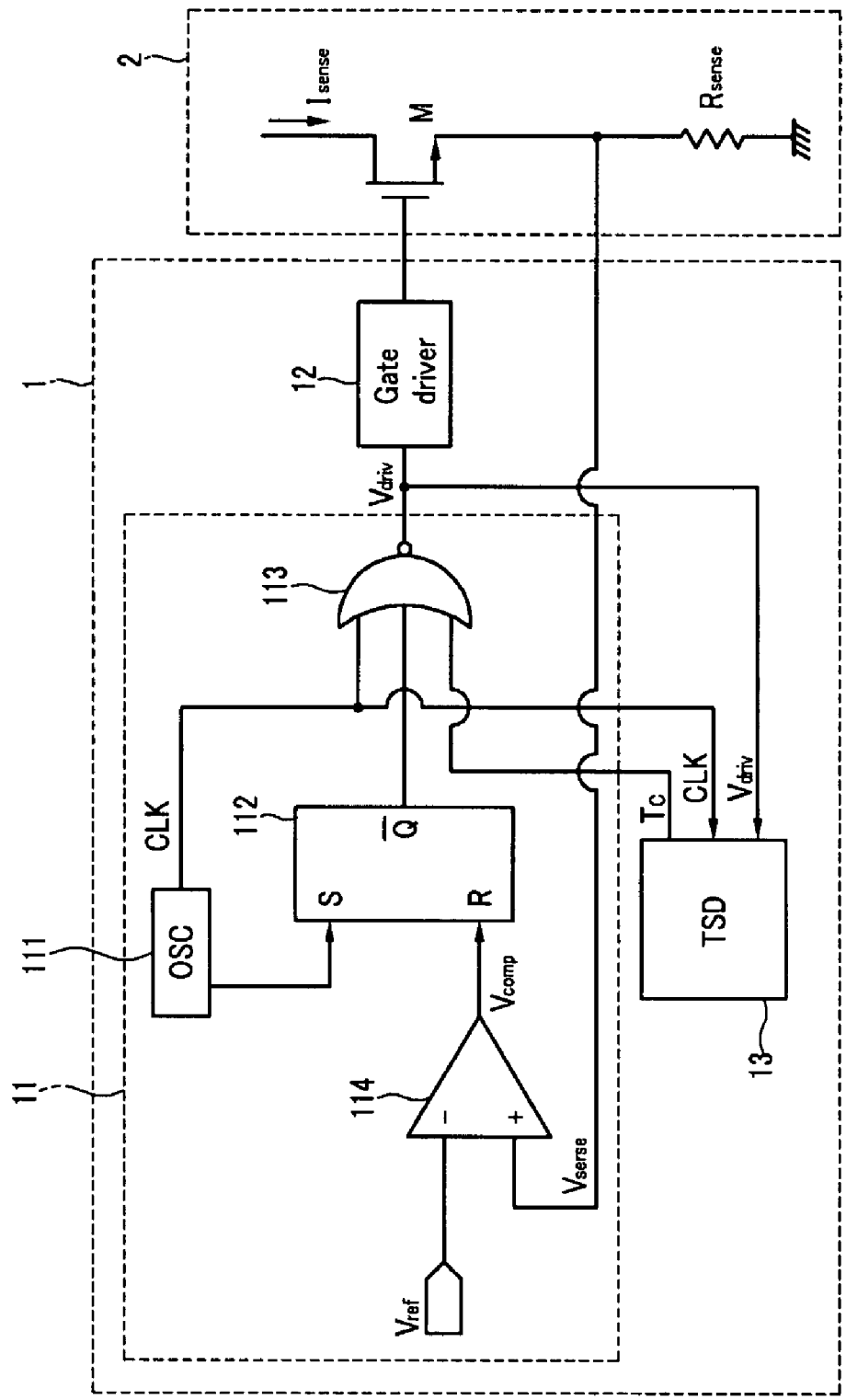
FIG. 1 illustrates a switch unit and a switch controller.

In the following detailed description, only certain exemplary embodiments of the present invention are shown and described, simply by way of illustration. As those skilled in the art would realize, the described embodiments may be modified in various different ways, all without departing from the spirit or scope of the present invention. Accordingly, the drawings and description are to be regarded only as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element.

FIG. 1 illustrates an embodiment of a switch controller and a switch unit. The switch controller 1 and the switch unit 2 can be formed as separate individual chips, and these individual chips can form a pack.

FIG. 1 illustrates that the switch unit 2 can include a switching transistor M and a sensor resistor Rsense. The switching transistor M can be an N-channel metal oxide semiconductor field effect transistor (MOFSET), or any one of its numerous equivalents. Hereinafter, the switching transistor M will be referred to as the main switch M. The main switch M can be turned on/off according to a signal output from the switch controller 1. The sensor resistor Rsense can sense a current flowing to the main switch M and can generate a sense voltage Vsense. The sense voltage Vsense can be transmitted to the switch controller 1.

The switch controller 1 can include a pulse width modulator (PWM) controller 11, a gate driver 12, and a Thermal Shutdown (TSD) unit 13.

The PWM controller 11 can compare the sense voltage Vsense to a reference voltage Vref. The PWM controller 11 can generate and output a gate driver control signal Vdriv according to a result of the comparison. In further detail, the PWM controller 11 can generate the gate driver control signal Vdriv that turns off the main switch M at a time when the sense voltage Vsense corresponds to the reference voltage Vref, and can generate a gate driver control signal Vdriv that turns on the main switch M at a falling edge time of a clock signal CLK.

After turning on the main switch M, the PWM controller 11 can generate a gate driver signal Vdriv that keeps the main switch in the turn-on state until the sense voltage Vsense becomes essentially equal to the reference voltage Vref or until a rising edge timing of the clock signal CLK. Then, the PWM controller 11 can determine whether to turn off the main switch M according to a predetermined maximum duty cycle. In some cases, although the sense voltage Vsense is no longer equal to the reference voltage Vref, the PWM controller 11 can generate a gate driver control signal Vdriv to forcibly turn off the main switch M at the rising edge timing of the clock signal CLK. In some embodiments, the reference voltage Vref corresponds to an output voltage generated by a switching operation.

FIG. 1 further illustrates that the PWM controller 11 can include an oscillator (OSC) 111, a PWM latch unit 112, a NOR gate 113, and a PWM comparator 114.

The OSC 111 can generate a clock signal CLK and output the clock signal to the TSD unit 13 and to a "set" terminal S of the PWM latch unit 112. The clock signal CLK can have a constant period Tperiod.

The PWM comparator 114 can receive the sense voltage Vsense and the reference voltage Vref, compare the two signals, and output a comparison signal Vcomp to a "reset" terminal R of the PWM latch unit 112 according to a result of the comparison.

The PWM latch unit 112 can perform a logic operation on the signals input to the set terminal S and the reset terminal R and output a signal to the NOR gate 113 according to a result of the logic operation. The PWM latch unit 112 can be operated similar to an operation of a conventional SR latch.

The NOR gate 113 can perform a NOR operation on signals input from the OSC 111, the PWM latch unit 112, and the TSD unit 13, generate a gate driver control signal Vdriv, and output the gate driver control signal Vdriv to the gate driver 12.

The gate driver 12 can receive the gate driver control signal Vdriv output by the NOR gate 113 within the PWM controller 11, and generate a turn-on/off signal for the main switch M according to the gate driver control signal Vdriv. The main switch M can be an N-channel transistor. The gate driver 12 can generate a high-level voltage signal to turn on the main switch M, and can generate a low-level voltage signal to turn off the main switch M.

The TSD unit 13 can generate a TSD signal Tc corresponding to heat transmitted from the switch unit 2. In further detail, the TSD unit 13 can generate a TSD reference voltage modification signal Vct by using the clock signal CLK and the gate driver control signal Vdriv input from the OSC 111 and the NOR gate 113, respectively. A heat response speed (i.e. the speed of the TSD unit 13 sensing the heat generated in the main switch, as further discussed at [0065]) of the TSD unit 13 can change in accordance with the TSD reference voltage modification signal Vct. The TSD unit 13 can generate a TSD signal Tc to control turning on/off of the main switch M according to the heat generated therefrom according to the changed response speed.

The TSD unit 13 will be described in further detail with reference to FIG. 2.

Figure 2:
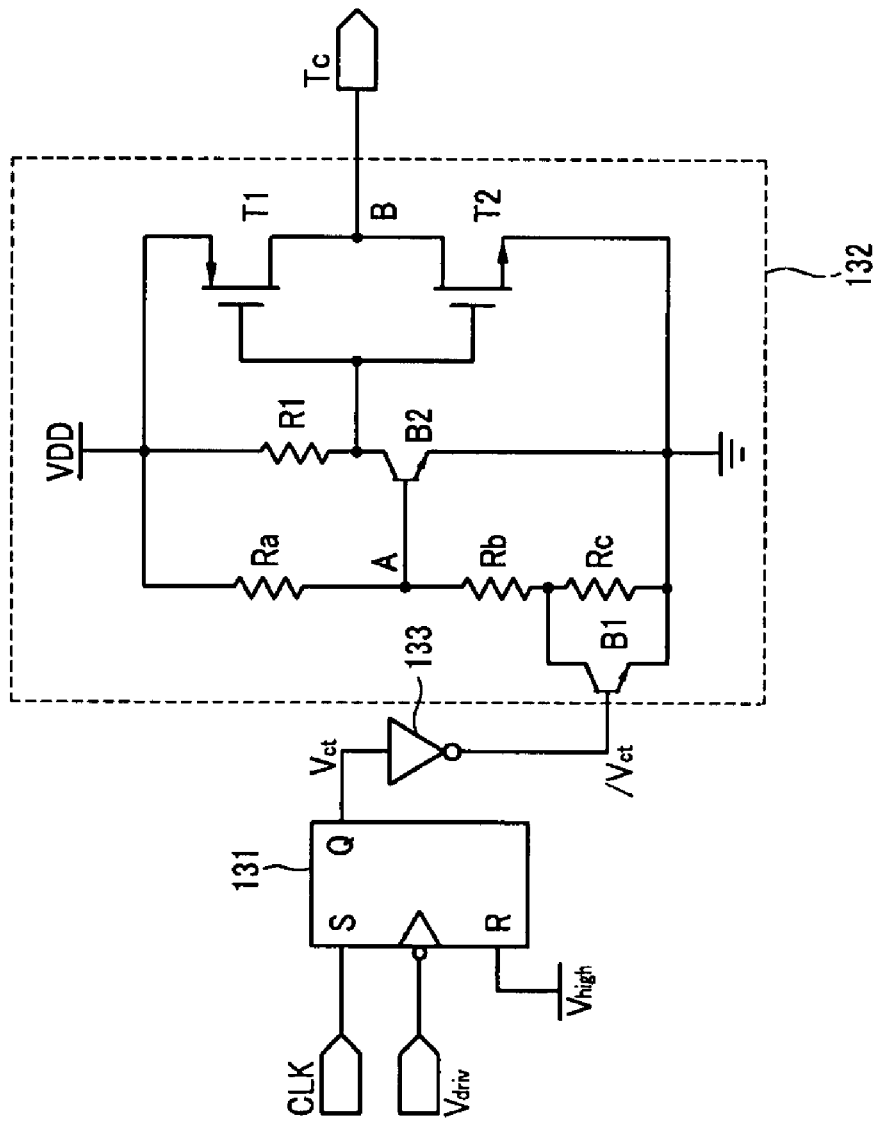
FIG. 2 illustrates a Thermal Shutdown (TSD) unit.

FIG. 2 illustrates an embodiment of the TSD unit 13. The TSD unit 13 can include a TSD flip-flop 131, a TSD signal generator 132, and an inverter 133.

The TSD flip-flop 131 can be triggered by the falling edge timing of the gate driver control signal Vdriv. The clock signal CLK can be input to a set terminal S of the TSD flip-flop 131 and a high-level signal can be input to a reset terminal R of the TSD flip-flop 131. The TSD flip-flop 131 can generate the TSD reference voltage modification signal Vct according to a result of a logic operation based on the signals input to the set and reset terminals S and R, when the gate driver control signal Vdriv is changed from a high level to a low level, thus following a falling edge timing. For example, the reference voltage modification signal Vct, output at a terminal Q, can assume a high-level when the input signals at both the set and reset terminals S and R assume the value 1.

The TSD reference voltage modification signal Vct can be output to the TSD signal generator 132. In further detail, the TSD flip-flop 131 can output a TSD reference voltage modification signal Vct of a high level at the terminal Q, regardless of a current status (i.e. the level of the TSD reference voltage modification signal Vct) when the clock signal CLK input at the set terminal S has a high level at the falling edge timing of the gate driver control signal Vdriv.

The inverter 133 can invert the TSD reference voltage modification signal Vct, output at the terminal Q of the TSD flip-flop 131, and transmit the inverted TSD reference voltage modification signal /Vct to the TSD signal generator 132.

The TSD signal generator 132 can include a plurality of resistors Ra, Rb, Rc, and R1, a high voltage source VDD, a TSD reference voltage modification switch B1, a heat sensor switch B2, a high side voltage switch T1, and a low side voltage switch T2. The heat sensor switch B2 and the TSD reference voltage modification switch B1 can be npn bipolar junction transistors (BJTs). A BJT includes a base, a collector, and an emitter. The base corresponds to a control electrode, the collector corresponds to a first electrode, and the emitter corresponds to a second electrode.

Hereinafter, the TSD reference voltage modification switch B1 is referred to as a first switch B1 and the heat sensor switch B2 is referred to as a second switch B2.

The high voltage switch T1 and the low voltage switch T2 can be respectively a p-channel MOSFET (hereinafter referred to as a first transistor T1) and an n-channel MOSFET (hereinafter referred to as a second transistor T2). A MOSFET includes a gate electrode, a drain electrode, and a source electrode. The gate electrode corresponds to a control electrode, the drain electrode corresponds to a first electrode, and the source electrode corresponds to a second electrode.

The resistors Ra, Rb, and Rc can be coupled in series between the high voltage source VDD and the ground. The first switch B1 can be coupled in parallel to the resistor Rc. The inverted TSD reference voltage modification signal /Vct can be input to the base of the first switch B1, and the emitter of the first switch B1 can be grounded. A first end of the resistor Ra can be coupled to the high voltage source VDD, and a second end of the resistor Ra can be coupled to a first end of the resistor Rb at a node A. A second end of the resistor Rb can be coupled to a first end of the resistor Rc. The node A can be coupled to the base of the second switch B2.

A first end of the resistor R1 can be coupled to the high voltage source VDD, and a second end of the resistor R1 can be coupled to the collector of the second switch B2. The emitter of the second switch B2 can be grounded. A source electrode of the first transistor T1 can be coupled to the high voltage source VDD, and a gate electrode of the first transistor T1 can be coupled to the second end of the resistor R1. A drain electrode of the second transistor T2 can be coupled to a drain electrode of the first transistor T1 at a node B, a gate electrode of the second transistor T2 can be coupled to the second end of the resistor R1, and the source electrode of the second transistor T2 can be grounded. The TSD signal Tc can be output at the node B of the drain electrodes of the first and second transistors T1 and T2.

The first switch B1 can be turned on or off according to the inverted TSD reference voltage modification signal /Vct. When the inverted TSD reference voltage modification signal /Vct has a high level, the first switch B1 can be turned on so that a voltage input to the base electrode of the second switch B2 becomes a first voltage $\{(VDD*Rb)/(Ra+Rb)\}$, obtained by distributing the high voltage VDD according to a resistance ratio $\{Rb/(Ra+Rb)\}$ of the resistor Ra and the resistor Rb.

When the inverted TSD reference voltage modification signal /Vct has a low level, the first switch B1 can be turned off and a voltage input to the base electrode of the second switch B2 becomes a second voltage $\{(VDD*(Rb+Rc))/(Ra+Rb+Rc)\}$, obtained by distributing the high voltage VDD according to a resistance ratio $\{(Rb+Rc)/(Ra+Rb+Rc)\}$ of the resistors Ra, Rb, and Rc. In some embodiments the second voltage is higher than the first voltage. In addition, the second voltage may be set to be lower than a threshold voltage of the second switch B1 at room temperature.

The TSD unit 13 can generate the TSD reference voltage modification signal Vct by using the clock signal CLK and the gate driver control signal Vdriv, and change a heat response speed for the main switch M by turning on/off the first switch B1 according to the TSD reference voltage modification signal Vct. When the first switch B1 is turned on, the voltage applied to the base of the second switch B2 is decreased so that the threshold voltage of the second switch B2 should be reduced to the first voltage by heat generated from the main switch M. In other words, the heat response speed of the main switch M is slower when the first switch B1 is turned on, than when the first switch B1 is turned off.

When the first switch B1 is turned off, the second voltage is applied to the base of the second switch B2, which is higher than the first voltage. Then, because of the heat generated at the main switch M, the threshold voltage level can reach the second voltage level when the first switch B1 is in the turn-off state faster than when the first switch B1 is in the turn-on state. Therefore, the heat response speed of the main switch M is faster when the first switch B1 is turned off than when the first switch B1 is turned on.

When the second switch B2 is turned off, a ground voltage can be applied to the gate electrodes of the first and second transistors T1 and T2. Then, the first transistor T1 is turned on and the second transistor T2 can be turned off so that a voltage level of the TSD signal Tc becomes substantially the same as that of the high voltage source VDD. On the other hand, when the second switch B2 is turned off, the voltage of the high voltage source VDD can be applied to the gate electrodes of the first and second transistors T1 and T2. Then, the second transistor T2 is turned on and the first transistor T1 is turned off so that the voltage level of the TSD signal Tc becomes substantially the same as the ground voltage.

An operation of the switch controller 1 will be described in further detail with reference to FIG. 3.

Figure 3:
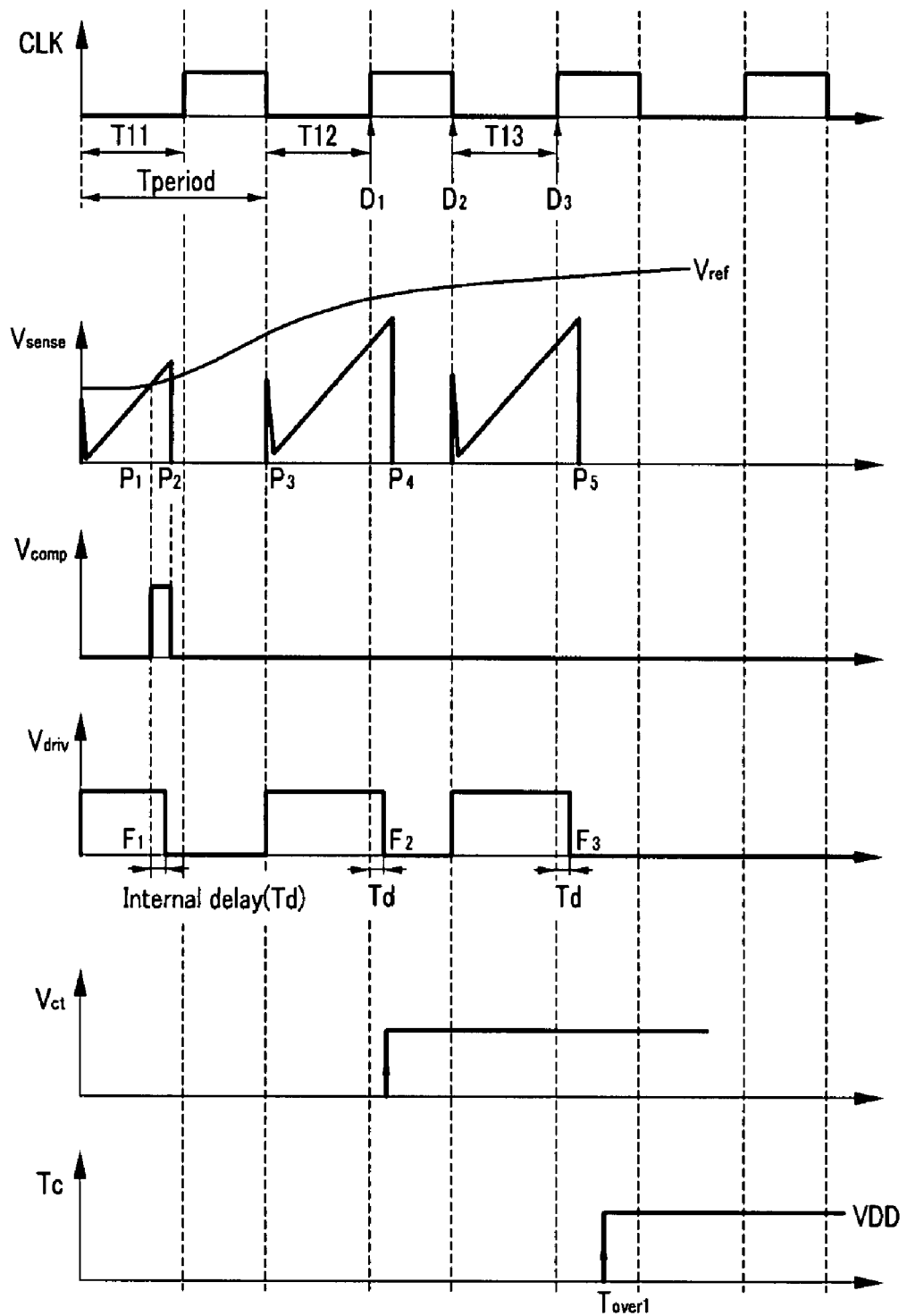
FIG. 3 is a waveform diagram of a signal generated by an operation of a switch controller.

FIG. 3 illustrates a clock signal CLK, a reference voltage Vref, a comparison signal Vcomp, a gate driver control signal Vdriv, and a TSD signal Tc in an embodiment of the switch controller 1.

As shown in FIG. 3, during a period T11, the clock signal CLK is low. At a time P1, the sense voltage Vsense becomes equal to the reference voltage Vref, and the PWM comparator 114 outputs a high comparison signal Vcomp to the PWM latch unit 112, until a time P2. The high comparison signal Vcomp is input to the reset terminal R of the PWM latch unit 112 at the time P1. This can cause the PWM latch unit 112 to output a high level signal at an inverted output terminal /Q, which is then transmitted to the NOR gate 113. The NOR gate 113 can then generate a low gate driver control signal Vdriv.

The gate driver control signal Vdriv can become low after being delayed for a period Td due to propagation delay. Since the TSD flip-flop 131 is triggered at a time F1 when the gate driver control signal Vdriv changes from high to low and the clock signal CLK, input at the set terminal S, is still low, the TSD flip-flop 131 can generate a low TSD reference voltage modification signal Vct. The low TSD reference voltage modification signal Vct is inverted at the inverter 133 to generate a high inverted TSD reference voltage modification signal /Vct.

The high inverted TSD reference voltage modification signal /Vct can turn on the first switch B1, and the first voltage $\{(VDD*Rb)/(Ra+Rb)\}$ can be input to the base of the second switch B2. The application of the first voltage turns off the second switch B2, thus turning on the second transistor T2. Therefore, the TSD signal generator 132 generates a TSD signal Tc of a ground voltage level. The TSD signal Tc of the ground voltage level can be transmitted to the NOR gate 113, and the NOR gate 113 can generate a low gate driver control signal Vdriv and apply Vdriv to the gate driver 12 by using the high-level signal output from the PWM latch unit 112.

At a later time P3 the reference voltage Vref is greater than the sense voltage Vsense, thus the PWM comparator 114 continues to output a low comparison signal Vcomp. Since the clock signal CLK becomes low at about P3 and the TSD signal Tc is low, the gate drive control signal Vdriv becomes high. Further, since the sense voltage Vsense does not increase higher than the reference voltage Vref during a period T12, the gate driver control signal Vdriv is triggered to become low at a time D1 when the clock signal CLK becomes high. In some cases the gate driver control signal Vdriv becomes low only at a later time F2, which is after D1 by a propagation delay time Td. Then, the main switch M can be turned off at a time P4, thus ceasing to generate the sense voltage Vsense.

The gate driver control signal Vdriv becoming low at time F2 can trigger the TSD flip-flop 131 because the clock signal CLK is high at the time F2. In response, the TSD flip-flop 131 generates a high TSD reference voltage modification signal Vct. The first switch B1 is turned off by a low inverted TSD reference voltage modification signal /Vct, and a second voltage $\{VDD*(Rb+Rc)/(Ra+Rb+Rc)\}$ is applied to the base of the second switch B2. The second voltage can be lower than the threshold voltage of the second switch B2 at room temperature.

Heat generated by the main switch M can decrease the threshold voltage of the second switch B2. This reduced threshold voltage can eventually become equal to the second voltage at a predetermined temperature, at which time the second switch B2 turns on. When the second switch B2 is turned on, the ground voltage is applied to the gate electrode of the first transistor T1 and the first transistor T1 turns on. This will result in outputting a TSD signal Tc with substantially the high voltage VDD at the NOR gate 113. In FIG. 3, a time when the threshold voltage of the second switch B2 decreases by the heat generated from the switch unit 2 to become equal to the second voltage is denoted as Tover1.

The TSD reference voltage modification signal Vct can become high and the inverted TSD reference voltage modification /Vct low at the time F2 so that the second voltage is applied to the base of the second switch B2. In this case, the second switch B2 turns off. Therefore, the TSD signal Tc becomes low since the first transistor T1 is turned off and the second transistor T2 is turned on.

At the time D2, the gate driver control signal Vdriv is triggered to become high when the clock signal CLK again becomes low. During a period T13, as in the period T12, the sense voltage Vsense neither crosses the reference voltage Vref nor increases higher than the reference voltage Vref. Therefore, when the clock signal CLK becomes high at the time D3 according to the maximum duty, the gate driver control signal becomes low at a time F3, delayed by the propagation delay Td from the time D3. Then, the main switch M is turned off at a time P5, ceasing to generate the sense voltage Vsense.

In this interval T13 the TSD reference voltage modification signal Vct is generated as at the time F2, in particular it is maintained at a high level. Due to the heat generated from the switch unit 2, the threshold voltage of the second switch B2 can decrease. As described above, the second voltage is applied to the base of the second switch B2. At the time Tover1, the threshold voltage of the second switch B2 becomes equal to the second voltage so that the second switch B2 turns on. Then, the first transistor T1 is turned on and the TSD signal Tc becomes substantially equal to the high voltage VDD. Since the level of the high voltage source VDD is substantially the high level, the NOR gate 113 receives a high TSD signal Tc and the gate drive control signal Vdriv becomes low.

Therefore, although the clock signal CLK becomes low after the time Tover1, the gate drive control signal Vdriv can remain low. However, when the heat generated from the main switch M of switch unit 2 decreases, the second switch B2 is turned off and the first transistor T1 is turned off, the gate drive control signal Vdriv becomes high at the next falling edge timing of the clock signal CLK.

As described, when the threshold voltage of the second switch B2 decreases due to the heat generated by the main switch M of the switch unit 2, the second switch B2 can be turned on by the second voltage efficiently. Accordingly, the switch unit 2 can be prevented from overheating due to a time delay needed for transmitting the heat in the conventional systems. In other words, the second voltage is higher than the first voltage, and therefore the second voltage can turn on the second switch B2 faster than in a conventional manner even though the threshold voltage of the second switch B2 is decreased less than by the heat generated in the main switch. When the second switch B2 is turned on, the TSD signal becomes high so that the gate drive control signal becomes low and the main switch M of the switch unit 2 is turned off. The turning off of the main switch M can prevent the overheating of the switch unit 2 at an early stage, thereby preventing damage to the switch unit 2.

Figure 4:
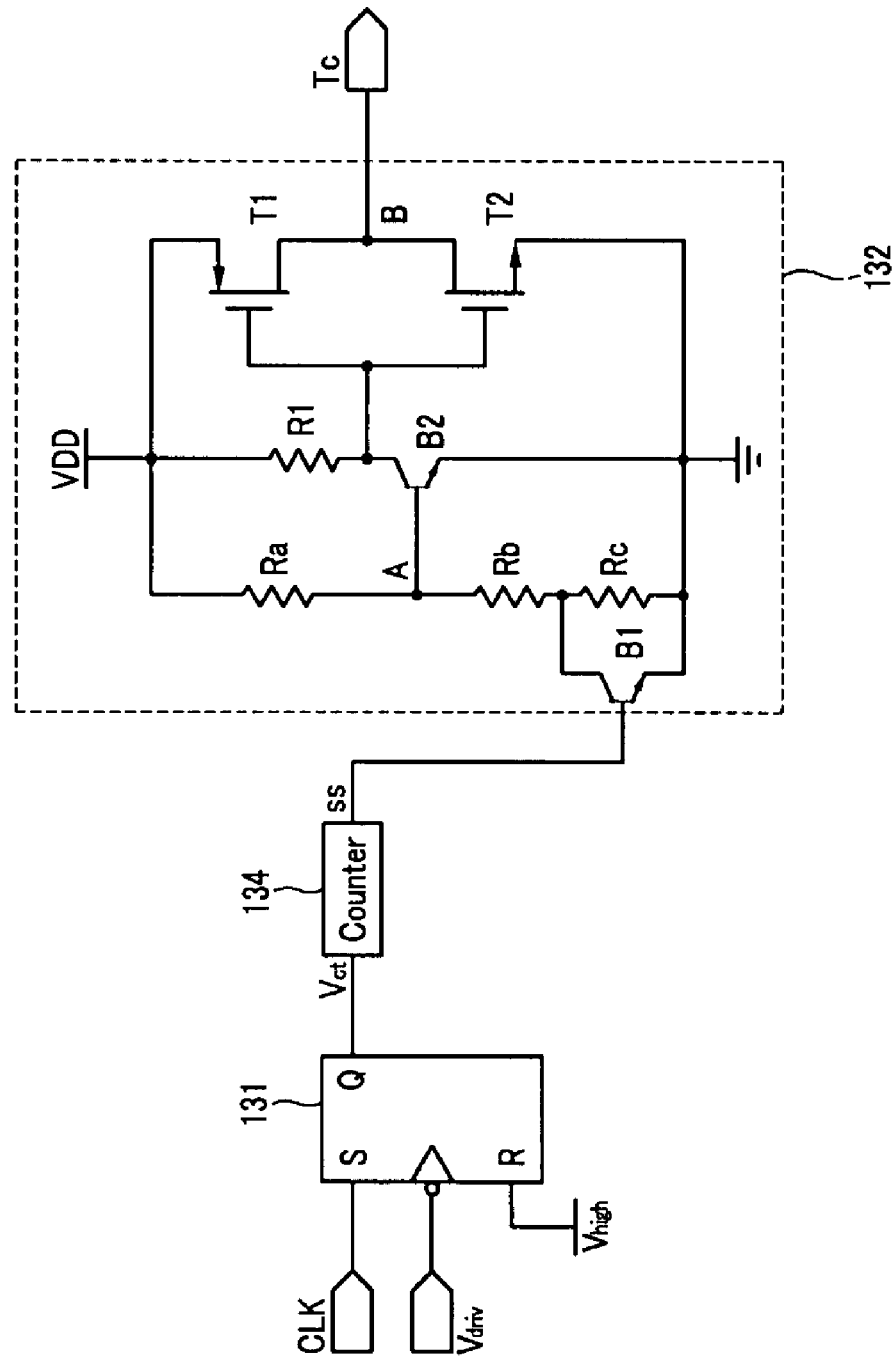
FIG. 4 illustrates a TSD unit.
Figure 5:
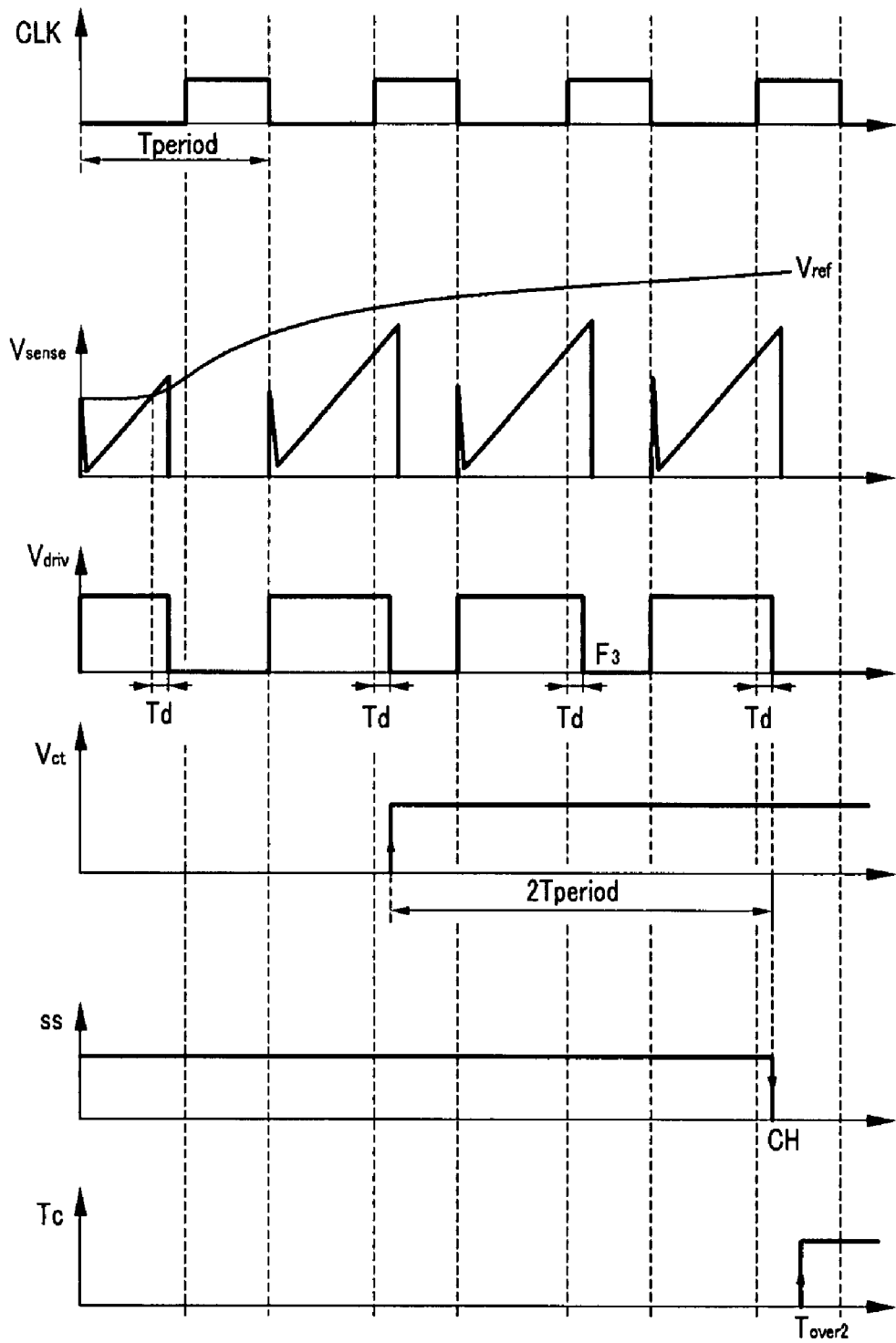
FIG. 5 is a waveform diagram of a signal generated by an operation of a switch controller.

FIGS. 4 and 5 illustrate another embodiment of a TSD unit 13a. The TSD unit 13a can count the length of a period when a TSD reference voltage modification signal Vct is maintained at a high level and can control an output of a high level TSD signal Tc when the period is repeated a predetermined number of times.

FIG. 4 illustrates the TSD unit 13a. The TSD unit 13a includes several elements of the TSD unit 13 of FIG. 2. In addition, it can also include a counter 134. The counter 134 can be coupled to the output terminal Q of the TSD flip-flop 131, count a period when the TSD reference voltage modification signal Vct is high, and generate a control signal SS of the first switch B1 according to the counting result. The counter 134 can output a low control signal SS when the TSD reference voltage modification signal Vct is high for two cycles of the clock signal CLK. When the TSD reference voltage modification signal Vct is not maintained at the high level for two cycles of the clock signal CLK, the counter 134 outputs a high control signal SS. Although it was described that the number of cycles for the high TSD reference voltage modification signal Vct is two, the number of cycles can be modified as necessary.

An operation of the TSD unit will be described in further detail with reference to FIG. 5. FIG. 5 illustrates a waveform diagram of a signal generated by the operation of a switch controller. The operation of the present embodiment of the switch controller is analogous to the operation described in relation to FIG. 3 until the time F3. However, unlike the first exemplary embodiment, the low inverted TSD reference voltage modification signal /Vct may not be input to the first switch B1 immediately after the TSD reference voltage modification signal Vct becomes high. The counter 134 can count a period when the TSD reference voltage modification signal Vct is high. When the counting result shows that the period of the TSD reference voltage modification signal Vct being high is less than two cycles, a high control signal SS can be output. When the TSD reference voltage modification signal Vct remains high for two cycles, the counter 134 can output a low control signal SS at a time CH. Then, the first switch B1 is turned off and the second voltage is applied to the base of the second switch B2.

Since the second transistor T2 is turned on during a period when the second switch B2 is not turned on by the second voltage, a low TSD signal Tc is output. However, when the threshold voltage of the second switch B2 becomes equal to the second voltage due to the heat of the switch unit 2 at a time Tover2, the second switch B2 is turned on and the first transistor T1 is turned on. Therefore, the TSD signal Tc becomes high at the time Tover2. Subsequent operations are performed analogously to FIG. 3.

In the described embodiment, a high level period of the TSD reference voltage modification signal Vct is counted to prevent the main switch from being turned off due to operational errors or noise.

The above described switch units, having a main switch and a switch controller can be formed as one chip in one pack, and the switch controller can prevent damage to the main switch by turning off the main switch when the main switch is overheated. In addition, when the main switch and the switch controller are formed as one pack, the main switch can be prevented from being damaged by turning off the main switch without delay when the main switch is overheated.

According to one aspect of the present invention, a switch controller turns off a switch corresponding to heat generated from the switch without a delay when the switch is overheated. Accordingly, the switch can be prevented from being damaged due to overheating.

According to another aspect of the present invention, a switch controller turns off a switch without a delay when the switch is continuously being overheated for a predetermined time period. Therefore, the switch can be prevented from being turned off due to a temporary overheat condition and can be prevented from damage due to a turn-off delay.

In addition, when a switch unit having a switch and a switch controller are respectively formed as one chip within one pack, or each chip forms a different pack, the switch controller can detect overheating of the switch and turn off the switch corresponding to the heat generated from the switch.

While this invention has been described in connection with specific embodiments, it is to be understood that the invention is not limited to the disclosed embodiments, but, on the contrary, is intended to cover various modifications and equivalent arrangements included within the spirit and scope of the appended claims.

What is claimed is:

1. A switch controlling apparatus for controlling a main switch by using a first signal that corresponds to a current flowing to the main switch, the switch controlling apparatus comprising:

a pulse width modulator (PWM) controller for controlling turning on the main switch according to a first edge of a clock signal and turning off the main switch by using one of a second edge of the clock signal and a comparing result of comparing the first signal with a reference voltage; and a temperature shutdown (TSD) unit for changing a response speed for the heat of the main switch by using the clock signal and the control signal, wherein the TSD unit increases the response speed for the heat of the main switch when the PWM controller turns off the main switch due to the second edge of the clock signal.

2. The switch controlling apparatus of claim 1, wherein the TSD unit comprises:
a first flip-flop being triggered by the control signal and generating a TSD reference voltage modification signal according to the clock signal;
a first switch being turned on/off according to the TSD reference voltage modification signal;
a second switch having a control electrode applied with a voltage that varies depending on a turn-on/off state of the first switch; and
a selection unit for generating a TSD signal having a level that varies depending on a turn-on/off state of the second switch, and outputting the TSD signal to the PWM controller.

3. The switch controlling apparatus of claim 2, wherein the second switch is an npn transistor that is turned on/off according to a level of a signal applied to the control electrode, and a threshold voltage of the transistor is changed depending on heat generated from the main switch.

4. The switch controlling apparatus of claim 3, wherein a second voltage is applied to the control electrode of the second switch when the first switch is in the turn-off state, and a first voltage is applied to the control electrode of the second switch when the first switch is in the turn-on state, the second voltage being higher than the first voltage.

5. The switch controlling apparatus of claim 2, wherein the TSD unit further comprises an input end coupled to an output end of the first flip-flop and an inverter having an output end coupled to the control electrode of the first switch.

6. The switch controlling apparatus of claim 5, wherein the first flip-flop is triggered when the control signal is changed to a second level from a first level, and the TSD reference voltage modification signal becomes a fourth level when the clock signal is a third level.

7. The switch controlling apparatus of claim 6, wherein the first switch is an N-channel transistor, and the first, third, and fourth levels are high levels, and the second level is a low level.

8. The switch controlling apparatus of claim 7, wherein, in the first flip-flop, the clock signal is input to a set end and a high-level signal is input to a reset end, and when both of the set end and the reset end receive high-level signals, a thermal shutdown (TSD) reference voltage modification signal of a high level is generated.

9. The switch controlling apparatus of claim 1, wherein the main switch and the switch controlling apparatus are included in different packs from each other.

10. The switch controlling apparatus of claim 1, wherein the main switch and the switch controlling apparatus are respectively formed as one chip and the respective chips are included in one pack.

11. The switch controller apparatus of claim 1, wherein the TSD unit increases the response speed for the heat of the main switch when the main switch is repeatedly changed to the turn-off state more than a predetermined number of times by the control signal due to the maximum duty cycle of the clock signal.

12. The switch controller apparatus of claim 11, wherein the TSD unit comprises:
a first flip-flop being triggered by the control signal, and generating a TSD reference voltage modification signal according to the clock signal;
a counter for detecting a change in a level of the TSD reference voltage modification signal, and determining whether the number of times that the control signal has turned off the main switch due to the maximum duty cycle of the clock signal is greater than a predetermined number of times;
a first switch being turned on/off according to the TSD reference voltage modification signal;
a second switch having a control electrode applied with a voltage that is changed according to a turn-on/off state of the first switch; and
a selection unit for generating a TSD signal having a level that varies in accordance with a turn-on/off state of the second switch, and outputting the TSD signal to the PWM controller.

13. The switch controlling apparatus of claim 12, wherein the second switch is an npn transistor that is turned on/off by a signal level applied to the control electrode, and a threshold voltage of the transistor is varied depending on heat generated from the main switch.

14. The switch controlling apparatus of claim 13, wherein the control electrode of the second switch is applied with a second voltage when the first switch is in the turn-off state, and is applied with a first voltage when the first switch is in the turn-on state, the second voltage being higher than the first voltage.

15. The switch controlling apparatus of claim 12, wherein the first flip-clop is triggered when the control signal is changed from a first level to a second level, and the TSD reference voltage modification signal becomes a fourth level when the clock signal is a third level.

16. The switch controlling apparatus of claim 15, wherein the first switch is an N-channel transistor, and the first, third, and fourth levels are high levels and the second level is a low level.

17. A switch controlling apparatus that controls turning on/off of a main switch, the switch controlling apparatus comprising:
a gate driver coupled to a control electrode of the main switch, and generating a main switch control signal for controlling turning on/off of the main switch;
a pulse width modulator (PWM) controller coupled to an input end of the gate driver and generating a gate driver control signal, the gate driver control signal for turning on the main switch according to a first edge of a clock signal, the gate driver control signal for turning off the main switch by using one of a second edge of the clock signal and a comparing result of comparing a signal corresponding to a current flowing to the main switch with a reference voltage, and an output voltage generated by the current flowing to the main switch; and
a thermal shutdown unit (TSD) unit for increasing a response speed for heat generated from the main switch when the main switch is turned off due to the second edge of the clock signal.

18. The switch controlling apparatus of claim 17, wherein the TSD unit comprises:
a first flip-flop for receiving the clock signal and the gate driver control signal, and triggered by the gate driver control signal;
a first switch turned on/off according to an output signal of the first flip-flop;
a second switch having a control electrode applied with a voltage that is changed according to a turn-on/off state of the first switch; and
a selection unit coupled to a first electrode of the second switch, generating a TSD signal of a first level and a TSD signal of a second level according to a turn-on/off state of the second switch, and transmitting the TSD signal to the PWM controller through an output end.

19. The switch controlling apparatus of claim 18, wherein the selection unit comprises:
- a first power source for supplying a voltage corresponding to the first level;
- a second power source for supplying a voltage corresponding to the second level;
- a first transistor having a first electrode coupled to the second power source, a control electrode coupled to the first electrode of the second switch, and a second electrode coupled to the output end; and
- a second transistor having a first electrode coupled to the second power source, a control electrode coupled to the first electrode of the second switch, and a second electrode coupled to the output end.

20. The switch controlling apparatus of claim 18, wherein the TSD unit further comprises:
- a first resistor having a first end coupled to a third power source and a second end coupled to the first electrode of the second switch;
- a second resistor having a first end coupled to the first power source and a second end coupled to the control electrode of the second switch;
- a third resistor having a first end coupled to the control electrode and a second end coupled to the first electrode of the first switch; and
- a fourth resistor having first and second ends coupled between the first and second electrodes of the first switch.

21. The switch controlling apparatus of claim 18, 19, or 20, wherein the TSD unit further comprises a counter coupled to the output end of the first flip-flop and counting a period when a signal output from the output end of the first flip-flop is a third level.

22. The switch controlling apparatus of claim 21, further comprising an inverter having an input end coupled to the output end of the counter and an output end coupled to the control electrode of the first switch.

23. The switch controlling apparatus of claim 22, wherein the third level is a high level, and the first switch is an N-channel transistor.

24. The switch controlling apparatus of claim 19, 19, or 20, wherein the TSD unit further comprises an inverter having an input end coupled to the output end of the first flip-flop and an output end coupled to the control electrode of the first switch.

25. The switch controlling apparatus of claim 24, wherein the first flip-flop is triggered when the gate driver control signal is changed to the low level from the high level, and generates an output signal of a high level when the clock signal is the high level.

26. The switch controlling apparatus of claim 25, wherein the first switch is N-channel transistor, the second switch is npn transistor and the first and second levels are respectively a high level and a low level.

27. The switch controlling apparatus of claim 26, wherein the first transistor is a P-channel transistor and the second transistor is an N-channel transistor.

28. The switch controlling apparatus of claim 27, wherein the first and third power sources supply a high-level voltage and the second and fourth power sources supply a low-level voltage.

29. The switch controlling apparatus of claim 17, wherein the PWM controller comprises:
- a comparator for comparing a voltage that corresponds to a current flowing to the main switch with a reference voltage that corresponds to an output voltage generated according to an operation of the main switch, and outputting a comparison signal according to the comparison result;
- a PWM latch unit for receiving the clock signal and the comparison signal through the set end and the reset end respectively, and generating an operation signal according to a result of a logic operation performed on the clock signal and the comparison signal; and
- a logic gate unit for receiving a signal output from the TSD unit, the clock signal, and the operation signal and generating the gate driver control signal according to a result of a logic operation.

30. The switch controlling apparatus of claim 29, wherein the comparator outputs a high-level signal when the voltage corresponding to the current flowing to the main switch is higher than the reference voltage, and outputs a low-level signal when the voltage corresponding to the current flowing to the main switch is lower than the reference voltage.

31. The switch controlling apparatus of claim 30, wherein the PWM latch unit is a typical set-reset (SR) latch and the logic gate unit is a NOR gate.

32. The switch controlling apparatus of claim 30, 30, or 31, wherein the TSD unit comprises:
- a first flip-flop for receiving the clock signal and the gate driver control signal, and triggered by the gate driver control signal;
- a first switch turned on/off according to an output signal of the first flip-flop;
- a second switch having a control electrode applied with a voltage that is changed depending on a turn-on/off state of the first switch; and
- a selection unit coupled to the first electrode of the second switch, generating a TSD signal of a first level and a TSD signal of a second level according to the turn-on/off state of the second switch, and transmitting the TSD signal to the PWM controller.

* * * * *